US008841765B2

(12) United States Patent
Haba et al.

(10) Patent No.: US 8,841,765 B2
(45) Date of Patent: Sep. 23, 2014

(54) MULTI-CHIP MODULE WITH STACKED FACE-DOWN CONNECTED DIES

(75) Inventors: Belgacem Haba, Saratoga, CA (US); Ilyas Mohammed, Santa Clara, CA (US); Piyush Savalia, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 736 days.

(21) Appl. No.: 13/092,376

(22) Filed: Apr. 22, 2011

(65) Prior Publication Data

US 2012/0267777 A1 Oct. 25, 2012

(51) Int. Cl.
*H01L 23/34* (2006.01)

(52) U.S. Cl.
USPC .......................... 257/724; 257/723; 257/686

(58) Field of Classification Search
USPC .......................... 257/686, 777, 723, 724, 778
See application file for complete search history.

(56) References Cited

U.S. PATENT DOCUMENTS

| | | | |
|---|---|---|---|
| 4,941,033 A | 7/1990 | Kishida | |
| 5,148,265 A | 9/1992 | Khandros et al. | |
| 5,148,266 A | 9/1992 | Khandros et al. | |
| 5,347,159 A | 9/1994 | Khandros et al. | |
| 5,679,977 A | 10/1997 | Khandros et al. | |
| 5,790,384 A | 8/1998 | Ahmad et al. | |
| 6,570,248 B1 * | 5/2003 | Ahn et al. | 257/724 |
| 6,680,212 B2 * | 1/2004 | Degani et al. | 438/14 |
| 7,176,506 B2 * | 2/2007 | Beroz et al. | 257/232 |
| 7,851,898 B2 * | 12/2010 | Nakamura et al. | 257/685 |
| 8,207,605 B2 * | 6/2012 | Kurita | 257/698 |
| 2004/0016999 A1 | 1/2004 | Misumi | |
| 2006/0063312 A1 | 3/2006 | Kurita | |
| 2007/0148819 A1 | 6/2007 | Haba et al. | |
| 2008/0246136 A1 | 10/2008 | Haba et al. | |
| 2010/0019377 A1 | 1/2010 | Arvelo et al. | |
| 2010/0258930 A1 * | 10/2010 | Oh | 257/686 |
| 2012/0018863 A1 | 1/2012 | Oganesian et al. | |
| 2012/0018868 A1 | 1/2012 | Oganesian et al. | |
| 2012/0018893 A1 | 1/2012 | Oganesian et al. | |
| 2012/0018894 A1 | 1/2012 | Oganesian et al. | |
| 2012/0018895 A1 | 1/2012 | Oganesian et al. | |
| 2012/0020026 A1 | 1/2012 | Oganesian et al. | |

FOREIGN PATENT DOCUMENTS

WO 9919911 A1 4/1999

OTHER PUBLICATIONS

International Search Report and Written Opinion for Application No. PCT/US2012/034034 dated Jun. 9, 2012.

* cited by examiner

*Primary Examiner* — S. V. Clark
(74) *Attorney, Agent, or Firm* — Lerner, David, Littenberg, Krumholz & Mentlik, LLP

(57) ABSTRACT

A microelectronic assembly can include a substrate having first and second surfaces, at least two logic chips overlying the first surface, and a memory chip having a front surface with contacts thereon, the front surface of the memory chip confronting a rear surface of each logic chip. The substrate can have conductive structure thereon and terminals exposed at the second surface for connection with a component. Signal contacts of each logic chip can be directly electrically connected to signal contacts of the other logic chips through the conductive structure of the substrate for transfer of signals between the logic chips. The logic chips can be adapted to simultaneously execute a set of instructions of a given thread of a process. The contacts of the memory chip can be directly electrically connected to the signal contacts of at least one of the logic chips through the conductive structure of the substrate.

26 Claims, 11 Drawing Sheets

MULTI-CHIP MODULE WITH STACKED FACE-DOWN CONNECTED DIES

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself.

As used in this disclosure with reference to a flat chip having a front face, the "area of the chip" should be understood as referring to the area of the front face. In "flip chip" designs, the front face of the chip confronts the face of a package substrate, i.e., the chip carrier, and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low overall height or dimension perpendicular to the plane of the circuit panel. Such thin microelectronic packages allow for placement of a circuit panel having the packages mounted therein in close proximity to neighboring structures, thus producing the overall size of the product incorporating the circuit panel.

Various proposals have been advanced for providing plural logic and/or memory chips in a single package or module. In the conventional "multi-chip module," all of the logic and/or memory chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148,265; 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite the advances that have been made in multi-chip packages, there is still a need for improvements in order to minimize the size and improve the performance of such packages. These attributes of the present invention are achieved by the construction of the microelectronic assemblies as described hereinafter.

BRIEF SUMMARY OF THE INVENTION

In accordance with an aspect of the invention, a microelectronic assembly can include an interconnection substrate having a first surface and a second surface remote from the first surface in a vertical direction, at least two logic chips overlying the first surface of the substrate, and a memory chip having a front surface with contacts thereon. The interconnection substrate can have conductive structure thereon. The interconnection substrate can have terminals exposed at the second surface for connection with a component. Each logic chip can have a plurality of signal contacts at a front surface thereof confronting the first surface of the interconnection substrate. The signal contacts of each logic chip can be directly electrically connected to the signal contacts of the other logic chips through the conductive structure of the substrate for transfer of signals between the logic chips. The signals can represent at least one of data or instructions. The logic chips can be adapted to simultaneously execute a set of instructions of a given thread of a process. Each logic chip can have a rear surface opposite the front surface. The front surface of the memory chip can confront the rear surface of each of the at least two logic chips. The contacts of the memory chip can be directly electrically connected to the signal contacts of at least one of the at least two logic chips through the conductive structure of the substrate.

In a particular embodiment, the microelectronic assembly can also include an intermediate interposer substrate located between first and second logic chips of the at least two logic chips in a horizontal direction perpendicular to the vertical direction. The intermediate interposer substrate can have at least one conductive via extending therethrough between opposing first and second surfaces thereof. The conductive structure of the substrate can include the at least one conductive via. In one embodiment, the microelectronic assembly can also include at least one solder connect extending from the front surface of the memory chip in the vertical direction and located between first and second logic chips of the at least two logic chips in a horizontal direction perpendicular to the vertical direction. The conductive structure of the substrate can include the at least one solder connect.

In an exemplary embodiment, the microelectronic assembly can also include at least one conductive pillar extending from the interconnection substrate in the vertical direction and located between first and second logic chips of the at least two logic chips in a horizontal direction perpendicular to the vertical direction. The conductive structure of the substrate can include the at least one conductive pillar. Each conductive pillar can be electrically connected to a respective conductive element exposed at the front surface of the memory chip by a conductive mass. In a particular embodiment, the microelectronic assembly can also include at least one conductive post extending from the front surface of the memory chip in the vertical direction and located between first and second logic chips of the at least two logic chips in a horizontal direction perpendicular to the vertical direction. The conductive structure of the substrate can include the at least one conductive post. Each conductive post can be electrically connected to a respective conductive element exposed at the first surface by a conductive mass.

In one embodiment, the microelectronic assembly can also include at least one conductive pillar extending from the interconnection substrate in the vertical direction and at least one conductive post extending from the front surface of the memory chip in the vertical direction. Each of the conductive pillars and posts can be located between first and second logic chips of the at least two logic chips in a horizontal direction perpendicular to the vertical direction. The conductive structure of the substrate can include the conductive pillars and posts. Each conductive pillar can be electrically connected to a respective conductive post by a conductive mass. In an exemplary embodiment, the interconnection substrate can include at least one raised surface extending above the first surface in the vertical direction. The at least one raised surface can be located between first and second logic chips of the at least two logic chips in a horizontal direction perpendicular to the vertical direction. The conductive structure of the substrate can include at least one conductive contact of the at least one raised surface.

In a particular embodiment, the at least one raised surface can include a plurality of stacked dielectric layers overlying the first surface of the interconnection substrate. In one embodiment, the microelectronic assembly can also include an encapsulant having a substantially planar major surface. The encapsulant can extend between first and second logic chips of the at least two logic chips in a horizontal direction perpendicular to the vertical direction. The major surface of the encapsulant can be substantially co-planar with the rear surface of each of the first and second logic chips. In an exemplary embodiment, the encapsulant can have at least one conductive via extending therethrough between the major surface and a second surface opposite the major surface. The conductive structure of the substrate can include the at least one conductive via.

In accordance with another aspect of the invention, a microelectronic assembly can include an interconnection substrate having a first surface and a second surface remote from the first surface in a vertical direction, at least two logic chips overlying the first surface of the substrate, and a memory chip having a front surface with contacts thereon and a rear surface opposite the front surface. The interconnection substrate can have conductive structure thereon. The interconnection substrate can have terminals exposed at the second surface for connection with a component. The logic chips can have adjacent parallel edges spaced apart by no more than 500 microns. Each logic chip can have a plurality of signal contacts at a front surface thereof confronting the first surface of the interconnection substrate. The signal contacts of each logic chip can be directly electrically connected to the signal contacts of the other logic chips through the conductive structure of the substrate for transfer of signals between the logic chips. The signals can represent at least one of data or instructions. The logic chips can be adapted to simultaneously execute a set of instructions of a given thread of a process. Each logic chip can have a rear surface opposite the front surface. The front surface of the memory chip can confront the rear surface of at least one of the at least two logic chips. The contacts of the memory chip can be directly electrically connected to the signal contacts of at least one of the at least two logic chips through the conductive structure of the substrate.

In an exemplary embodiment, the microelectronic element can also include at least one wire bond extending from the front surface of the memory chip to the first surface of the interconnection substrate. The at least one wire bond can be located between first and second logic chips of the at least two logic chips in a horizontal direction perpendicular to the vertical direction. The conductive structure of the substrate can include the at least one wire bond. In one embodiment, the interconnection substrate can have an effective CTE less than 10 ppm/° C. In a particular embodiment, the microelectronic element can also include a second substrate having a surface that faces the second surface of the interconnection substrate. The second substrate can have contacts electrically connected with the terminals of the interconnection substrate. The second substrate can have an effective CTE greater than or equal to 10 ppm/° C. and can have second terminals on a surface opposite the surface that faces the interconnection substrate.

In one embodiment, the interconnection substrate can have an effective CTE less than 7 ppm/° C. In an exemplary embodiment, the at least two logic chips can have substantially identical structure. In a particular embodiment, the conductive structure of the substrate can include a plurality of electrically conductive traces extending in a direction substantially parallel to the first surface. In one embodiment, the microelectronic element can also include a heat spreader at least partially overlying a rear surface of at least one of the logic chips. In an exemplary embodiment, the heat spreader can at least partially overlie the memory chip. In a particular embodiment, the memory chip can have a first width in a horizontal direction perpendicular to the vertical direction and first and second logic chips of the at least two logic chips can have a combined second width in the horizontal direction. The first width can be less than the second width.

In a particular embodiment, the heat spreader can include a pedestal portion extending beyond a lower surface thereof. The pedestal portion can contact the rear surface of at least one of the first and second logic chips. In one embodiment, the memory chip can at least partially overlie an upper surface of the heat spreader. In an exemplary embodiment, the conductive structure of the substrate can include a lead extending through an opening in the heat spreader. In a particular embodiment, the microelectronic assembly can also include a plurality of heat spreaders including said heat spreader. Each of the plurality of heat spreaders can at least partially overlie a rear surface of at least one of the logic chips. The conductive structure of the substrate can include a lead extending between edges of two adjacent ones of the plurality of heat spreaders.

Further aspects of the invention provide systems that incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

In accordance with yet another aspect of the invention, a method of fabricating a microelectronic assembly can include providing an interconnection substrate, electrically connecting signal contacts of at least two logic chips to one another through conductive structure of the substrate for transfer of signals between the logic chips, and electrically connecting contacts exposed at a front surface of a memory chip to the signal contacts of at least one of the at least two logic chips through the conductive structure of the substrate. The interconnection substrate can have a first surface, a second surface remote from the first surface in a vertical direction, and terminals exposed at the second surface for connection with a component. The signals can represent at least one of data or instructions. The logic chips can be adapted to simultaneously execute a set of instructions of a given thread of a process. Each logic chip can have a front surface confronting the first surface of the interconnection substrate. The front surface of the memory chip can confront the rear surface of each of the at least two logic chips.

In one embodiment, the method can also include providing an encapsulant between the at least two logic chips in a horizontal direction perpendicular to the vertical direction. In a particular embodiment, the step of electrically connecting the contacts exposed at the front surface of the memory chip can include forming openings extending in the vertical direction through the encapsulant between a major surface thereof and the first surface of the substrate, forming conductive vias in contact with the contacts of the conductive structure of the substrate and extending within the openings, and electrically connecting the contacts of the memory chip with the conductive vias. Contacts of the conductive structure of the substrate can be exposed within the openings. The openings can be located between first and second logic chips of the at least two logic chips in the horizontal direction.

In an exemplary embodiment, the first and second logic chips can each have a rear surface opposite the respective front surface thereof. The step of providing the encapsulant can include planarizing a major surface of the encapsulant so that the major surface is substantially co-planar with the rear surface of each of the first and second logic chips. In one embodiment, the planarizing can be performed by lapping the major surface of the encapsulant and the rear surface of each of the first and second logic chips.

DETAILED DESCRIPTION

Figure 1:
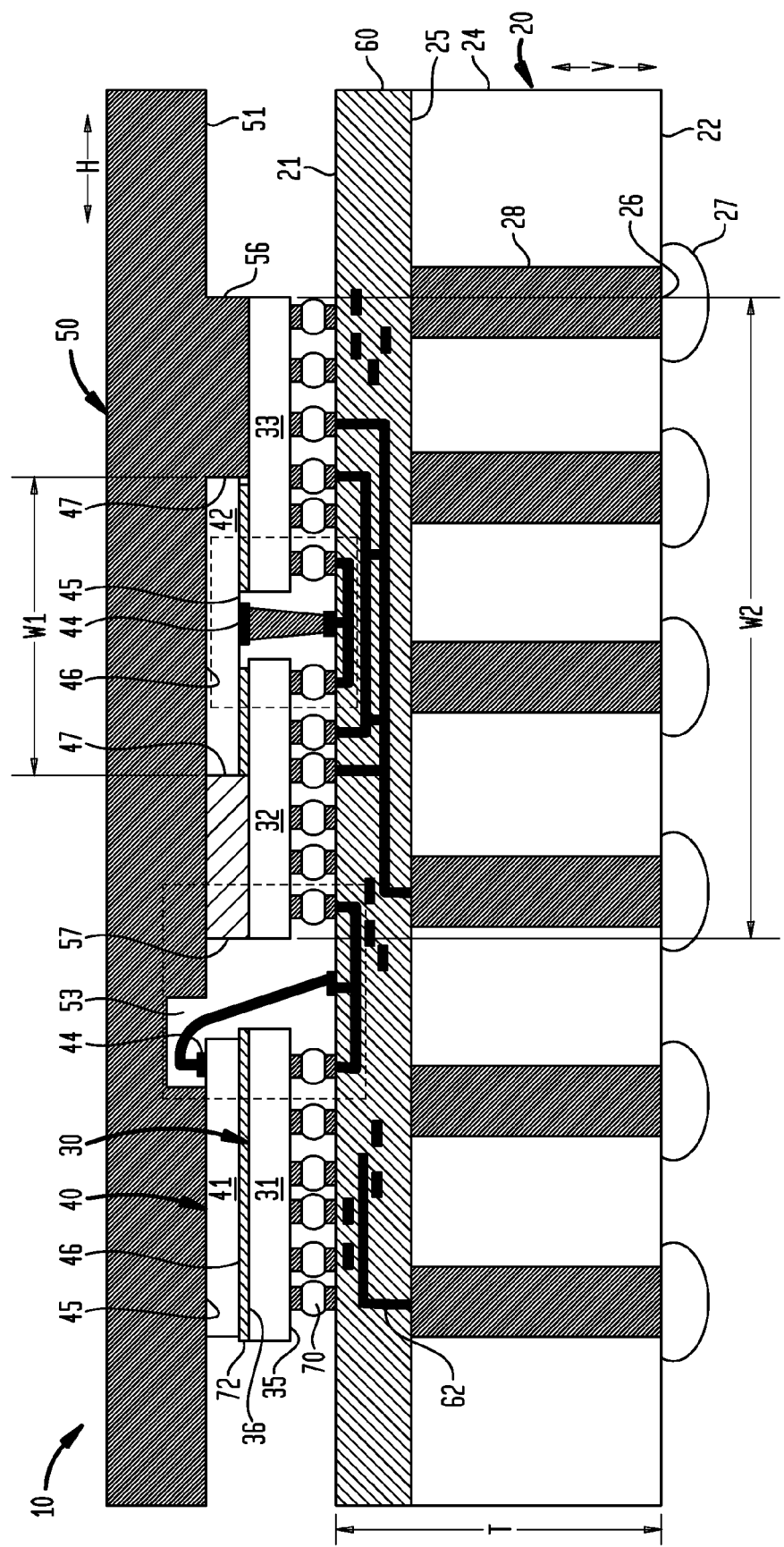
FIG. 1 is a diagrammatic sectional view of a stacked microelectronic assembly according to an embodiment of the present invention.

With reference to FIG. 1, a microelectronic assembly according to an embodiment of the present invention includes an interconnection substrate 20, logic chips 30 overlying a first surface 21 of the substrate 20, memory chips 40, each memory chip at least partially overlying a rear surface 36 of at least one of the logic chips, and at least one heat spreader 50 overlying a surface of each memory chip.

In FIG. 1, the directions parallel to the first surface 21 are referred to herein as "horizontal" or "lateral" directions, whereas the directions perpendicular to the front surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The interconnection substrate 20 can have a thickness T between the first surface 21 and a second surface 22 remote from the first surface in a vertical direction V substantially perpendicular to the first surface. The thickness T typically is less than 200 µm, and can be significantly smaller, for example, 130 µm, 70 µm or even smaller.

The interconnection substrate 20 can have an interposer portion 24 extending from the second surface 22 to an intermediate surface 25. The interposer portion 24 preferably has a coefficient of thermal expansion ("CTE") less than $10*10-6/° C.$ (or ppm/° C.). In a particular embodiment, the interposer portion 24 can have a CTE less than $7*10-6/° C.$ (or ppm/° C.). The interposer portion 24 preferably consists essentially of a material such as semiconductor, glass, or ceramic.

The interconnection substrate 20 can have one or more dielectric layers 60 that can overlie the intermediate surface 25 of the interposer portion 24. The dielectric layers 60 can extend from the intermediate surface 25 of the interposer portion 24 to the first surface 21 of the interconnection substrate 20, such that an exposed surface of the dielectric layers 60 defines the first surface of the interconnection substrate. Such dielectric layers 60 can electrically insulate conductive elements of the interconnection substrate 20 from one another and from the interposer portion 24. The dielectric layers 60 can include an inorganic or organic dielectric material or both. In one example, the dielectric layers 60 can include an electrodeposited conformal coating or other dielectric material, for example, a photoimageable polymeric material, for example, a solder mask material.

In the embodiments described herein, the dielectric layers 60 can be bonded to the interposer portion 24 and can have a thickness that is substantially less than a thickness of the interposer portion, such that the interconnection substrate 20 can have an effective CTE that is approximately equal to the CTE of the interposer portion, even if the CTE of the dielectric layer is substantially higher than the CTE of the interposer portion. In one example, the interconnection substrate 20 can have an effective CTE less than $10*10-6/° C.$ (or ppm/° C.).

In a particular example, the interconnection substrate 20 can have an effective CTE less than 7*10–6/° C. (or ppm/° C.).

Electrical contacts 23 are exposed at the first surface 21 of the interconnection substrate 20. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure.

Electrical terminals 26 are exposed at the second surface 22 of the substrate 20 for interconnection with another component, such as a circuit board. The electrical terminals 26 can be electrically connected to another component through conductive masses 27.

The conductive masses 27 can comprise a fusible metal having a relatively low melting temperature, e.g., solder, tin, or a eutectic mixture including a plurality of metals. Alternatively, the conductive masses 27 can include a wettable metal, e.g., copper or other noble metal or non-noble metal having a melting temperature higher than that of solder or another fusible metal. Such wettable metal can be joined with a corresponding feature, e.g., a fusible metal feature of a circuit board to externally interconnect the microelectronic assembly 10 to such circuit board. In a particular embodiment, the conductive masses 27 can include a conductive material interspersed in a medium, e.g., a conductive paste, e.g., metal-filled paste, solder-filled paste or isotropic conductive adhesive or anisotropic conductive adhesive.

A plurality of electrically conductive traces 62 can extend along a surface of a respective dielectric layer 60, along the first surface 21 of the substrate 20, and/or between adjacent dielectric layers. Some of the traces 62 may be electrically connected to one or more of the contacts 23. The interposer portion 24 of the interconnection substrate 20 includes conductive vias 28 extending between one or more of the traces 62 and respective electrical terminals 26.

The logic chips 30 include first, second, and third logic chips 31, 32, and 33. Each of the logic chips 30 can overlie the first surface 21 of the interconnection substrate 20. Each logic chip 30 can have a plurality of conductive contacts 34 at a front surface 35 thereof confronting the first surface 21 of the interconnection substrate 20, such that each logic chip 30 is oriented face-down with respect to the first surface of the interconnection substrate. The contacts 34 of each logic chip 30 can be exposed at a surface of a dielectric layer (not shown) overlying the front surface 35 of the logic chip. One or more of such dielectric layers can be referred to as a "passivation layer" of the logic chip 30. Each logic chip 30 can have a rear surface 36 opposite the front surface 35 thereof.

In a particular embodiment, each logic chip 30 can be flip-chip mounted to the contacts 23 exposed at the first surface 21 of the interconnection substrate 20. The contacts 34 of each logic chip 30 can be electrically connected to the contacts 23 by conductive masses 70 such as solder balls or any other material described above with reference to the conductive masses 27.

A plurality of active semiconductor devices (e.g., transistors, diodes, etc.) can be disposed in an active semiconductor region of each logic chip 30 located at and/or below the front surface 35. The logic chips 30 can be electrically connected to one another through the traces 62. The logic chips 30 can have substantially identical structure and can be adapted to function as a single processor, e.g., a multi-core processor, and/or such logic chips can be adapted to simultaneously execute a set of instructions of a given thread of a process. As used herein, logic chips 30 that are considered to have "substantially identical structure" can have identical structure to one another, or such logic chips 30 can have minor variations relative to one another.

In a particular embodiment, the contacts 34 of each of the logic chips 30 can be signal contacts. In such an embodiment, the signal contacts 34 of each logic chip 30 can be directly electrically connected to the signal contacts of the other logic chips through conductive structure of the substrate (e.g., the plurality of electrically conductive traces 62, the electrical contacts 23 exposed at the first surface 21, etc.) for transfer of signals between the logic chips, the signals representing at least one of data or instructions.

The memory chips 40 can include first and second memory chips 41 and 42. Each of the memory chips 40 can at least partially overlie the rear surface 36 of at least one of the logic chips 30. Each logic chip 30 can have a plurality of conductive contacts 44 at a front surface 45 thereof. The contacts 44 of each memory chip 40 can be arranged, for example, in one or two parallel rows. A row of contacts 44 can extend along the an edge of the front surface 45, as shown in the first memory chip 41, or along the center of the front surface 45, as shown in the second memory chip 42. Each memory chip 40 can have a rear surface 46 opposite the front surface 45 thereof.

The rear surface 46 of the first memory chip 41 can confront the rear surface 36 of the first logic chip 31, such that the first memory chip can be oriented face-up with respect to the first surface 21 of the substrate 20. An example memory chip 40 that is mounted face-up overlying the rear surface 36 of a logic chip 30 can also be seen in FIG. 8.

The front surface 45 of the second memory chip 42 can confront the rear surfaces 36 of the second and third logic chips 32 and 33, such that the second memory chip can be oriented face-down with respect to the first surface 21 of the substrate 20. An example memory chip 40 that is mounted face-down overlying the rear surfaces 36 of two adjacent logic chips 30 can also be seen in FIG. 8. In a particular embodiment, shown in FIG. 8, a plurality of memory chips 40 can be mounted face-down overlying the rear surfaces 36 of two adjacent logic chips 30. In one embodiment, shown in FIG. 8, a single memory chip 40' can be mounted face-down overlying the rear surface 36 of four adjacent logic chips 30.

In one example, the first memory chip 41 can be attached to the first logic chip 31 by an adhesive layer 72 extending between the rear surface 46 of the first memory chip and the rear surface 36 of the first logic chip.

In a particular embodiment, the second memory chip 42 can be attached to the second and third logic chips 32 and 33 by adhesive layers 72 extending between the front surface 45 of the second memory chip and the rear surfaces 36 of the second and third logic chips. In such an embodiment, the adhesive layers 72 can extend along the front surface 45 of the second memory chip 42 near lateral edges 47 thereof, such that the adhesive layers do not contact the contacts 44 of the second memory chip.

The contacts 44 of each memory chip 40 can be exposed at a surface of a dielectric layer (not shown) overlying the front surface 45 of the memory chip. One or more of such dielectric layers can be referred to as a "passivation layer" of the memory chip 40. Each memory chip 40 can be electrically connected to at least one of the logic chips 30 through the plurality of electrically conductive traces 62.

Each of the memory chips 40 can include a memory storage element. As used herein, a "memory storage element" refers to a multiplicity of memory cells arranged in an array, together with circuitry usable to store and retrieve data therefrom, such as for transport of the data over an electrical interface.

In some embodiments, the plurality of electrically conductive traces 62, the electrical contacts 23 exposed at the first surface 21 of the interconnection substrate 20, the conductive masses 70, and other conductive elements overlying the first surface 21 of the interconnection substrate 20 or extending within the interconnection substrate can be considered to be conductive structure of the interconnection substrate. In such embodiments, the logic chips 30 can be directly electrically connected to one another through the conductive structure of the substrate, and at least one of the memory chips 40 can be directly electrically connected to at least one of the logic chips 30 through the conductive structure of the substrate.

The heat spreader 50 can be made, for example, from any thermally conductive material, including a metal such as titanium, tungsten, copper, or gold. The heat spreader 50 can spread heat across the area of the first surface 21 of the interconnection substrate 20, which can result in improved thermal performance compared to a microelectronic assembly without such a heat spreader. The heat spreader 50 can overlie most of the first surface 21 of the interconnection substrate 20. In any of the embodiments described herein, there can be a plurality of heat spreaders 50 that together can function to spread heat across the area of at least a portion of the first surface 21 of the interconnection substrate 20.

The heat spreader 50 can at least partially overlie the rear surface 36 of at least one of the logic chips 30. The heat spreader 50 can at least partially overlie the front surface 45 of the first memory chip 41 and the rear surface 46 of the second memory chip 42. As shown in FIG. 1, the heat spreader 50 can directly contact the front surface 45 of the first memory chip 41 and the rear surface 46 of the second memory chip 42. A lower surface 51 of the heat spreader 50 can have a gap or recess 53 so that the heat spreader does not directly contact the contacts 44 of the face-up first memory chip 41.

The heat spreader 50 can overlie and can be in thermal communication with the memory chips 40 and the logic chips 30, either directly, or indirectly with additional thermally conductive material such as solder, thermally conductive adhesive, or a thermal grease disposed therebetween. In an example embodiment where the heat spreader 50 contacts one memory chip 40 (e.g., the second memory chip 42) and two logic chips 30 (e.g., the second and third logic chips 32 and 33), the memory chip can have a first width W1 in a horizontal direction E substantially parallel to the first surface 21 of the substrate 20, and the logic chips can have a combined second width W2 in the horizontal direction, the first width being less than the second width. In such an embodiment, having the width W1 be less than the width W2 can provide portions of the rear surfaces 36 of one or both of the two logic chips 30 that extend beyond a lateral edge 47 of the memory chip 40, such that heat can transfer directly from the rear surfaces of the logic chips to one or more pedestal portions 56 of the heat spreader 50 extending beyond the lower surface 51 to contact a logic chip, or such that heat can transfer indirectly from the rear surfaces of the logic chips to the lower surface 51 of the heat spreader 50 through a thermal adhesive 57 disposed therebetween. Such a relationship between a memory chip 40 having a width W1 and two adjacent logic chips 30 having a combined width W2 can also be seen in FIG. 8.

Figure 2:
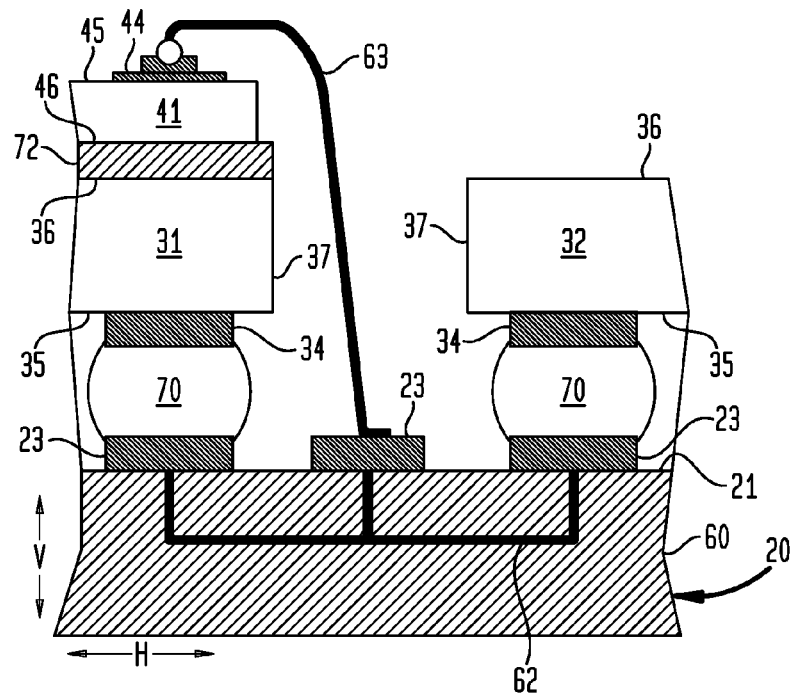
FIG. 2 is an enlarged fragmentary sectional view of a portion of FIG. 1 illustrating a wire bond connection between a face-up memory chip and an interconnection substrate.

FIG. 2 shows further details of the electrical connection between the contacts 44 of the first memory chip 41 and the contacts 23 exposed at the first surface 21 of the interconnection substrate 20 shown in FIG. 1. Some or all of the contacts 44 can be electrically connected to the contacts 23 by respective wire bonds 63 extending therebetween. Such wire bonds 63 can be located between lateral edges 37 of the first and second logic chips 31 and 32 in the horizontal direction E. The first memory chip 41 can be connected to the plurality of electrically conductive traces 62 through at least one of the wire bonds 63. In an exemplary embodiment having contacts 44 of a memory chip 41 that are electrically connected to contacts 23 of the substrate 20 by respective wire bonds 63 extending therebetween, the wire bonds can extend between adjacent logic chips 31 and 32 having adjacent parallel edges 37 spaced apart by no more than 500 microns.

Figure 8:
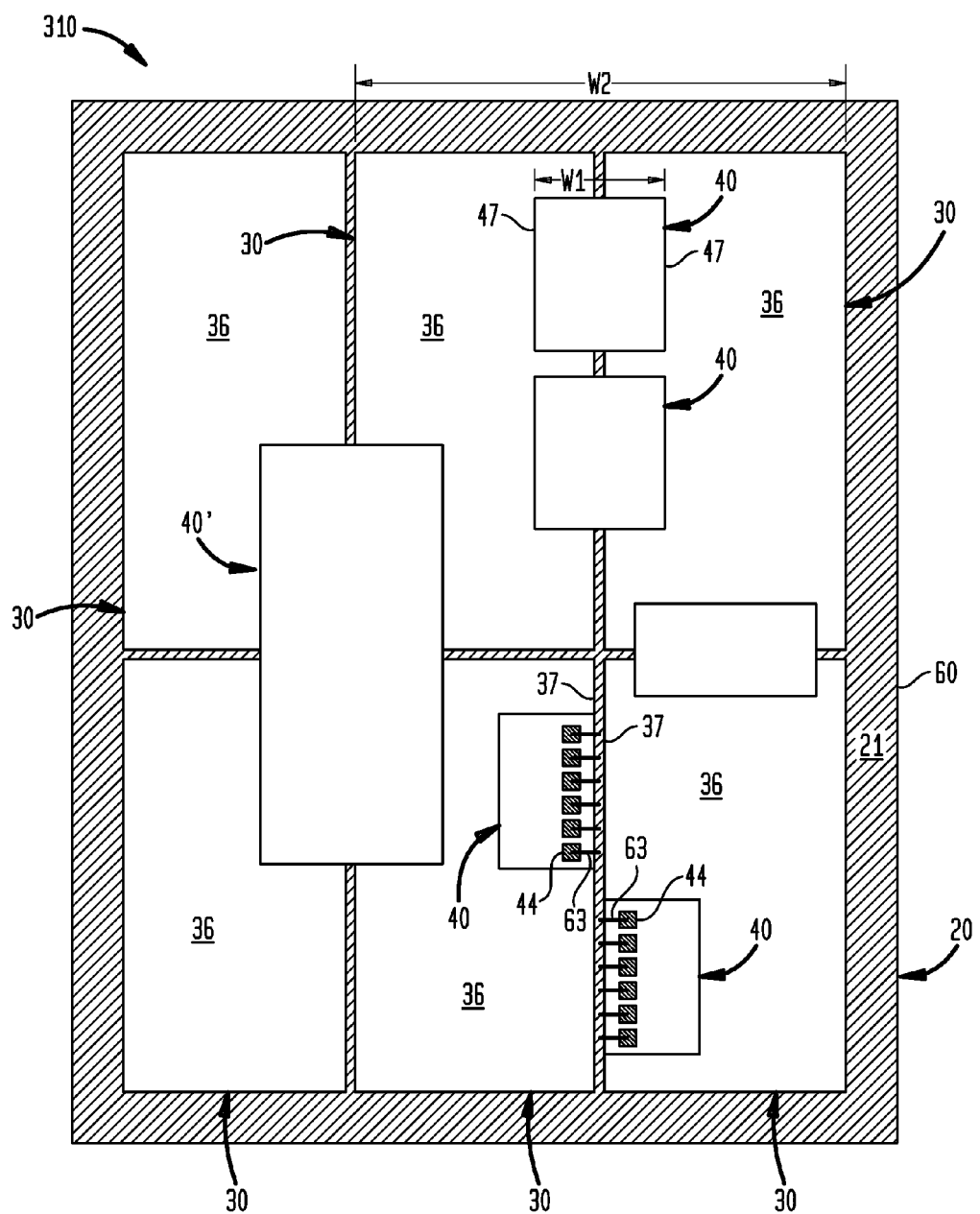
FIG. 8 is a top-down plan view that can correspond to the microelectronic assemblies shown in FIGS. 1 through 7B.

An example embodiment of the wire bonds 63 extending between the lateral edges 37 of adjacent logic chips 30 from a row of contacts 44 of a memory chip 40 to the first surface 21 of the interconnection substrate 20 can also be seen in FIG. 8. In a particular embodiment, shown in FIG. 8, wire bonds 63 extending between a plurality of memory chips 40 and the first surface 21 of the interconnection substrate 20 can extend between the lateral edges 37 of two adjacent logic chips 30.

Figure 3A:
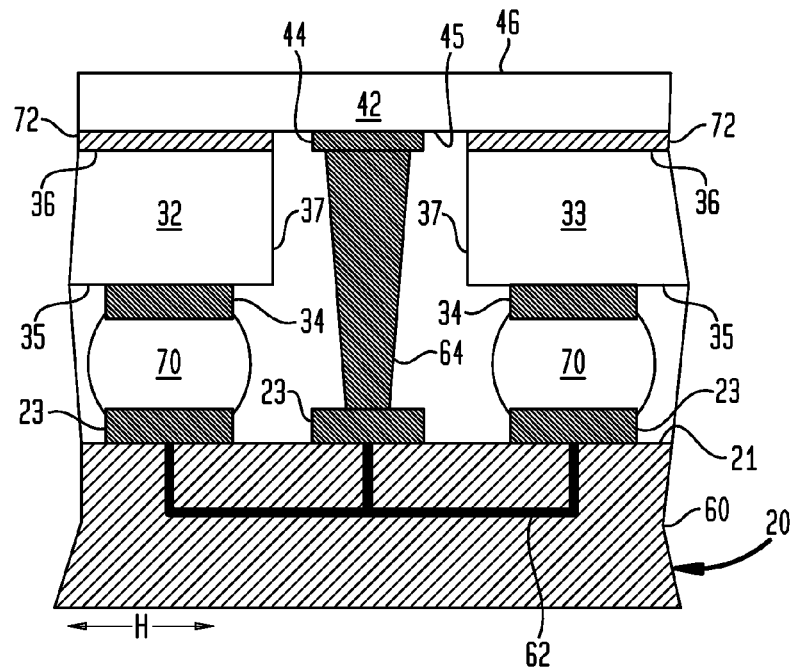
FIG. 3A is an enlarged fragmentary sectional view of a portion of FIG. 1 illustrating an electrical connection between a face-down memory chip and an interconnection substrate.

FIG. 3A shows further details of the electrical connection between the contacts 44 of the second memory chip 42 and the contacts 23 exposed at the first surface 21 of the interconnection substrate 20 shown in FIG. 1. Some or all of the contacts 44 can be electrically connected to the contacts 23 by respective conductive posts 64 extending therebetween. Such conductive posts 64 can be located between lateral edges of the second and third logic chips 32 and 33 in the horizontal direction E. The second memory chip 42 can be connected to the plurality of electrically conductive traces 62 through at least one of the conductive posts 64.

The conductive posts 64 (and any of the other conductive posts described herein) can have any shape, including frustoconical (as shown in FIG. 3A) or cylindrical. In embodiments where the conductive posts 64 have a frustoconical shape, the cross-sectional diameter of the posts 64 can taper in either direction between the contacts 44 and the contacts 23.

Figure 3B:
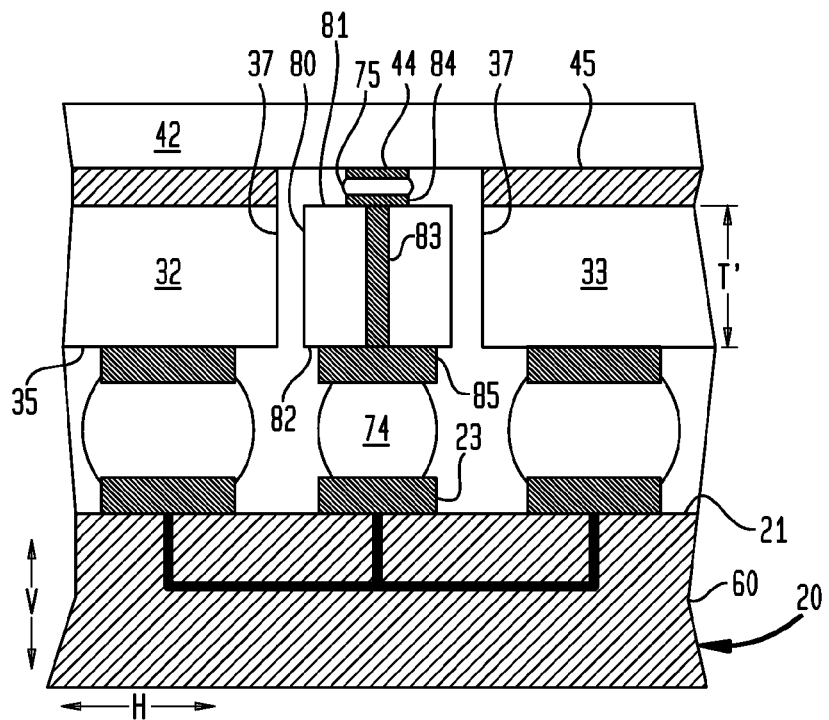
FIGS. 3B-3E are enlarged fragmentary sectional views of alternative embodiments of FIG. 3A.

FIG. 3B shows an alternate embodiment of the electrical connection between the contacts 44 of the second memory chip 42 and the contacts 23 exposed at the first surface 21 of the interconnection substrate 20 shown in FIG. 1. As shown in FIG. 3B, some or all of the conductive posts 64 of FIG. 1 can be replaced by respective conductive vias 83 extending through at least one intermediate interposer substrate 80 and respective conductive masses 74.

The intermediate interposer substrate 80 can have a first surface 81 confronting the front surface 45 of the second memory chip 42 and a second surface 82 opposite therefrom in the vertical direction V, and can be located between opposing lateral edges 37 of the second and third logic chips 32 and 33 in the horizontal direction E. The substrate 80 can be have a coefficient of thermal expansion ("CTE") less than 10*10–6/° C. (or ppm/° C.). The substrate 80 can have substantially the same thickness T' in the vertical direction V between the first and second surfaces 81 and 82 as the second and third logic chips 32 and 33.

The substrate 80 can have at least one conductive via 83 extending between the first and second surfaces 81 and 82. Each via 83 can be electrically connected to a respective contact 84 exposed at the first surface 81 and a respective contact 85 exposed at the second surface 82. Each contact 84 can be connected with a respective contact 44 of the second memory chip 42 by a conductive mass 75. Each contact 85 can be connected with a respective contact 23 exposed at the first surface 21 of the interconnection substrate 20 by a conductive mass 74. The conductive masses 74 and 75 can be solder balls or any other material described above with reference to the conductive masses 27.

The electrical connections between some or all of the contacts 44 and the contacts 23 can include respective ones of the conductive vias 83. The second memory chip 42 can be connected to the plurality of electrically conductive traces 62 through at least one of the conductive vias 83.

Figure 3C:
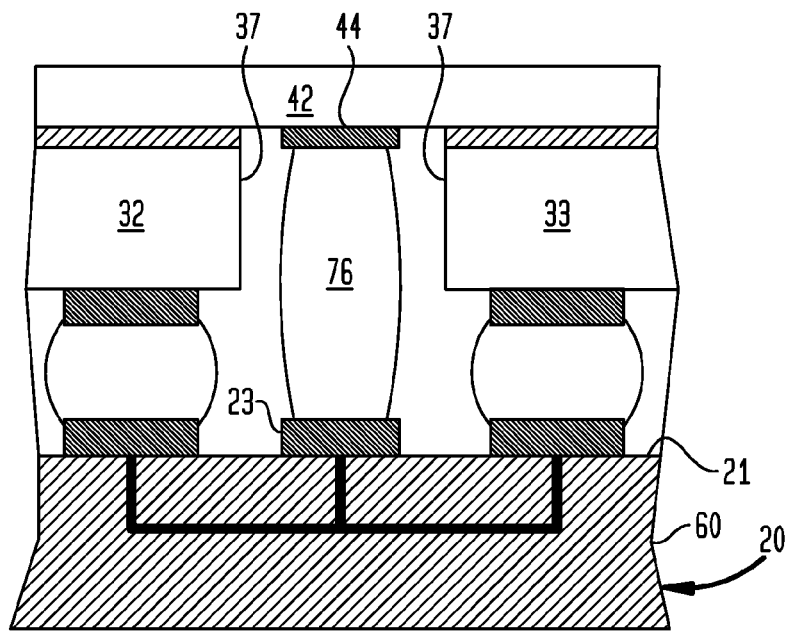

FIG. 3C shows another alternate embodiment of the electrical connection between the contacts 44 of the second memory chip 42 and the contacts 23 exposed at the first surface 21 of the interconnection substrate 20 shown in FIG. 1. As shown in FIG. 3C, some or all of the conductive posts 64 of FIG. 1 can be replaced by respective elongated conductive masses 76. The elongated conductive masses 76 can be elongated solder connects or any other material described above with reference to the conductive masses 27.

Figure 3D:
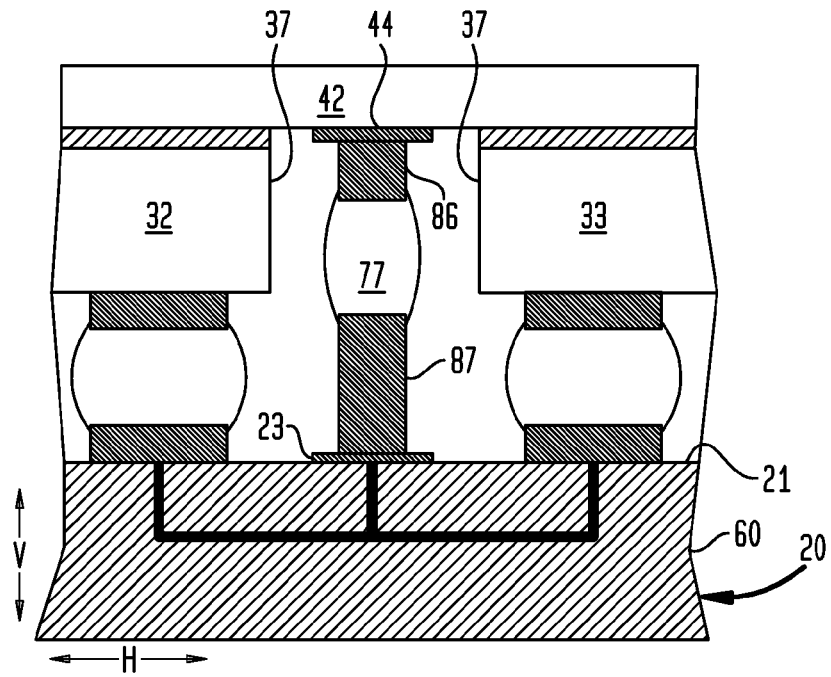

FIG. 3D shows yet another alternate embodiment of the electrical connection between the contacts 44 of the second memory chip 42 and the contacts 23 exposed at the first surface 21 of the interconnection substrate 20 shown in FIG. 1. As shown in FIG. 3D, some or all of the conductive posts 64 of FIG. 1 can be replaced by respective conductive posts 86 and conductive pillars 87. The conductive posts 86 and pillars 87 typically are solid metal bumps or protrusions that typically consist essentially of copper, copper alloy, nickel, or gold, or a combination thereof. In one example, the posts 86, the pillars 87, or both the posts and the pillars can be formed by plating into openings in a removable layer such as a photoresist mask. In another example, the posts 86, the pillars 87, or both the posts and the pillars can be formed by etching one or more metal layers overlying the first surface 21 of the interconnection substrate 20 and/or the front surface 45 of the second memory chip 42.

Each of the conductive posts 86 can extend from a respective conductive contact 44 exposed at the front surface 45 of the second memory chip 42 in the vertical direction V and can be located between opposing lateral edges 37 of the second and third logic chips 32 and 33 in the horizontal direction E. Each of the conductive pillars 87 can extend from a respective conductive contact 23 extending from the first surface 21 of the interconnection substrate 20 in the vertical direction V and can be located between opposing lateral edges 37 of the second and third logic chips 32 and 33 in the horizontal direction H.

Corresponding ones of the conductive posts 86 and conductive pillars 87 can be electrically connected to one another by respective conductive masses 77. The conductive masses 77 can be elongated solder connects or any other material described above with reference to the conductive masses 27. The second memory chip 42 can be connected to the plurality of electrically conductive traces 62 through at least one conductive post 86 and conductive pillar 87.

The conductive posts 86 and the conductive pillars 87 can have any shape, including frustoconical or cylindrical (as shown in FIG. 3D). In some cases, a conductive post 86 can be essentially identical with the conductive pillar 87 to which it is connected. In embodiments where the conductive posts 86 and the conductive pillars 87 have a frustoconical shape, the cross-sectional diameter of the posts and/or pillars can taper in either direction between the contacts 44 and the contacts 23.

In one embodiment, some or all of the contacts 44 of the second memory chip 42 can be electrically connected to corresponding contacts 23 exposed at the major surface 61 by conductive posts 86 and conductive masses, but without including the conductive pillars 87. In such an embodiment, each conductive post 86 can be directly connected with a corresponding contact 23 by a conductive mass.

In another embodiment, some or all of the contacts 44 of the second memory chip 42 can be electrically connected to corresponding contacts 23 exposed at the first surface 21 of the interconnection substrate 20 by conductive pillars 87 and conductive masses, but without including the conductive posts 86. In such an embodiment, each conductive pillar 87 can be directly connected with a corresponding contact 44 of the second memory chip 42 by a conductive mass.

Figure 3E:
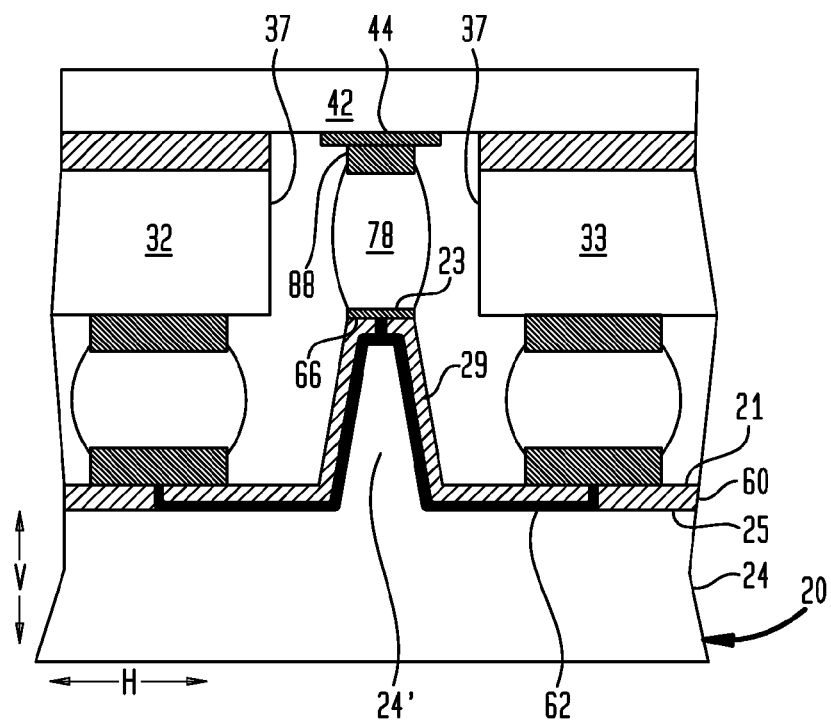

FIG. 3E shows still another alternate embodiment of the electrical connection between the contacts 44 of the second memory chip 42 and the contacts 23 exposed at the first surface 21 of the interconnection substrate 20 shown in FIG. 1. As shown in FIG. 3E, some or all of the conductive posts 64 of FIG. 1 can be replaced by respective conductive posts 88 and at least one raised surface 66 of the interconnection substrate 20.

Each raised surface 66 can be an upward-facing surface of a respective raised portion 29 of the interconnection substrate 20 extending above the first surface 21 thereof in the vertical direction V. Each raised surface 66 can be located between opposing lateral edges 37 of the second and third logic chips 32 and 33 in the horizontal direction H. As shown in FIG. 3E, each raised portion 29 can include a raised section 24' of the interposer portion 24, and the dielectric layers 60 can be deposited overlying the interposer portion and the raised section thereof.

Each raised surface 66 can have at least one conductive contact 23 exposed thereat that is electrically connected with the plurality of electrically conductive traces 62. The second memory chip 42 can be electrically connected to the plurality of traces 62 through at least one conductive contact 23 of the at least one raised surface 66.

Each of the conductive posts 88 can extend from a respective conductive contact 44 exposed at the front surface 45 of the second memory chip 42 in the vertical direction V and can be located between opposing lateral edges 37 of the second and third logic chips 32 and 33 in the horizontal direction E. Each conductive post 88 can be connected with a respective contact 23 of a raised surface 66 by a conductive mass 78. The conductive masses 78 can be solder balls or any other material described above with reference to the conductive masses 27.

In embodiments where each raised portion 29 includes a raised section 24' of the interposer portion 24, the raised section can be formed by applying a mask layer such as a photoresist layer to locations of an initial surface of the interposer portion 24 where it is desired to form the raised sections, and the interposer portion can then be etched in locations not protected by the mask layer, such that the protected raised sections extend above the intermediate surface 25. Subsequently, the mask layer can be removed and the dielectric layers 60 can be deposited overlying the interposer portion 24 and the raised section 24' thereof.

In a particular embodiment (not shown), each raised portion 29 can be made from a dielectric material such as any of the materials described above with reference to the dielectric layers 60. In such an embodiment, each raised portion 29 can include a plurality of stacked dielectric layers overlying the first surface 21 of the interconnection substrate 20. In one example, each raised portion 29 can be formed using a dielectric build-up process.

Figure 4:
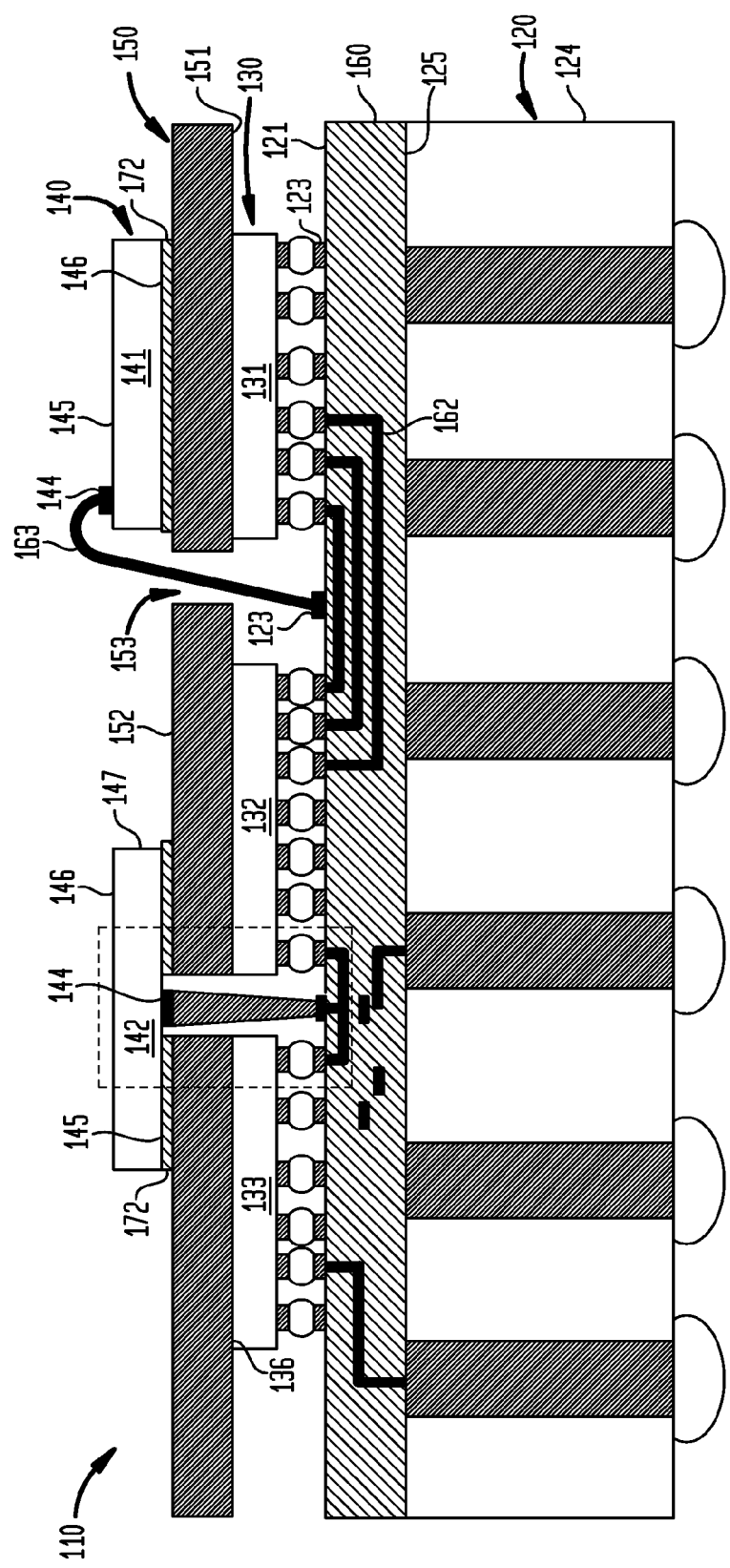
FIG. 4 is a diagrammatic sectional view of a stacked microelectronic assembly according to another embodiment having a heat sink located between the memory chips and the logic chips.

Referring now to FIG. 4, a microelectronic assembly 110 according to an embodiment of the present invention includes an interconnection substrate 120, logic chips 130 overlying a first surface 121 of the substrate 120, memory chips 140, each memory chip at least partially overlying a rear surface 136 of at least one of the logic chips, and a heat spreader 150 overlying a rear surface of each logic chip. One or more dielectric layers 160 can overlie the first surface 121 of the substrate 120.

The interconnection substrate 120 having an interposer portion 124 and one or more dielectric layers 160 overlying the intermediate surface 125 thereof are the same as the interconnection substrate 20, the interposer portion 24, and the dielectric layers 60 described above with reference to FIG. 1.

The logic chips 130 are the same as the logic chips 30 described above with reference to FIG. 1, except that the first logic chip 131 is located at the right side of FIG. 4, and the second and third logic chips 132 and 133 are located at the left of FIG. 4.

The heat spreader 150 is the same as the heat spreader 50 described above with reference to FIG. 1, except that the heat spreader overlies the logic chips 130 and underlies the memory chips 140. As shown in FIG. 4, the heat spreader 150 can directly contact rear surfaces 136 of the logic chips 130. In a particular embodiment, a thermal adhesive (not shown) can be disposed between a lower surface 151 of the heat spreader 150 and the rear surfaces 136 of the logic chips 130. In one example, the heat spreader 150 can at least partially overlie the rear surface 136 of at least one of the logic chips 130.

The memory chips 140 are the same as the memory chips 40 described above with reference to FIG. 1, except that the first memory chip 141 is located at the right side of FIG. 4, and the second memory chip 142 is located at the left side of FIG. 4.

Each of the memory chips 140 can at least partially overlie the rear surface 136 of at least one of the logic chips 130 and an upper surface 152 of the heat spreader 150. The rear surface 146 of the first memory chip 141 can confront the upper surface 152 of the heat spreader 150, such that the first memory chip can be oriented face-up with respect to the first surface 121 of the substrate 120. The front surface 145 of the second memory chip 142 can confront the upper surface 152 of the heat spreader 150, such that the second memory chip can be oriented face-down with respect to the first surface 121 of the substrate 120.

In one example, the first memory chip 141 can be attached to the heat spreader 150 by an adhesive layer 172 extending between the rear surface 146 of the first memory chip and the upper surface 152 of the heat spreader. In a particular embodiment, the second memory chip 142 can be attached to the heat spreader 150 by adhesive layers 172 extending between the front surface 145 of the second memory chip and the upper surface 152 of the heat spreader. In such an embodiment, the adhesive layers 172 can extend along the front surface 145 of the second memory chip 142 near lateral edges 147 thereof, such that the adhesive layers do not contact the contacts 144 of the second memory chip.

Similar to the microelectronic assembly 10 of FIG. 1, some or all of the contacts 144 of the first memory chip 141 can be electrically connected to the contacts 123 by respective wire bonds 163 extending therebetween. Such wire bonds 163 can be located between lateral edges 137 of the first and second logic chips 131 and 132 in a horizontal direction H, and such wire bonds can extend through an opening 153 extending through the heat spreader 150 between the upper and lower surfaces 152 and 151. The first memory chip 141 can be connected to the plurality of electrically conductive traces 162 through at least one of the wire bonds 163. In one embodiment (not shown), the wire bonds 163 can extend between lateral edges of two adjacent heat spreaders 150 rather than extending through an opening 153 in a single heat spreader.

Figure 5A:
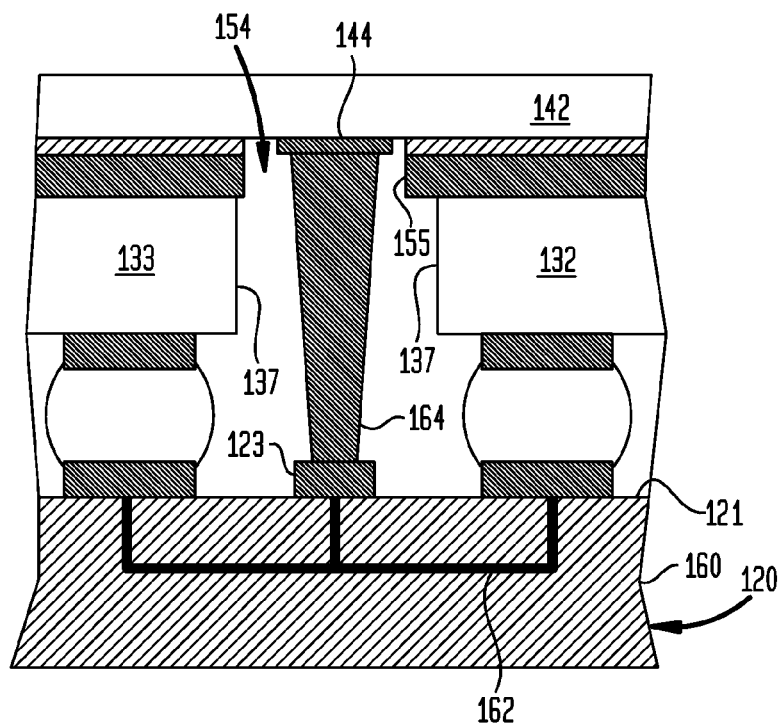
FIG. 5A is an enlarged fragmentary sectional view of a portion of FIG. 4 illustrating an electrical connection between a face-down memory chip and an interconnection substrate.

FIG. 5A shows further details of the electrical connection between the contacts 144 of the second memory chip 142 and the contacts 123 exposed at the first surface 121 of the interconnection substrate 120 shown in FIG. 4. Similar to the microelectronic assembly 10 of FIG. 1, some or all of the contacts 144 can be electrically connected to the contacts 123 by respective conductive posts 164 extending therebetween. Such conductive posts 164 can be located between lateral edges 137 of the second and third logic chips 132 and 133 in the horizontal direction H, and such conductive posts can extend through an opening 154 extending through the heat spreader 150 between the upper and lower surfaces 152 and 151. The second memory chip 142 can be connected to the plurality of electrically conductive traces 162 through at least one of the conductive posts 164. In one embodiment (not shown), the conductive posts 164 can extend between lateral edges of two adjacent heat spreaders 150 rather than extending through an opening 154 in a single heat spreader.

In a particular embodiment (not shown), some or all of the conductive posts 164 can conform to a contour of the inner surface 155 of the respective opening 154, such that each conductive post and its respective opening can be considered to be a through heat sink conductive via. In such an embodiment having a conductive via extending through an opening of the heat spreader 150, a dielectric layer can extend between the conductive via and an inner surface of the opening to separate and insulate the conductive via from the heat spreader. In one example, the heat spreader can have at least one through heat sink conductive via extending therethrough between the opposing upper and lower surfaces thereof, such that at least one memory chip 140 can be electrically connected to the plurality of traces 162 through the conductive via.

In some embodiments, the wire bonds 163 extending through an opening 153 in the heat spreader 150 or the conductive posts 164 extending through an opening 154 in the heat spreader can be considered to be leads extending through an opening in the heat spreader, and the conductive structure of the substrate 120 can be considered to include such leads. As used herein, a "lead" is a portion of or the entire electrical connection extending between two electrically conductive elements, such as the lead comprising the wire bond 163 that extends from one of the contacts 144 of the first memory chip 141, through the opening 153 in the heat spreader 150, to one of the conductive contacts 123 exposed at the first surface 121 of the interconnection substrate 120.

Figure 5B:
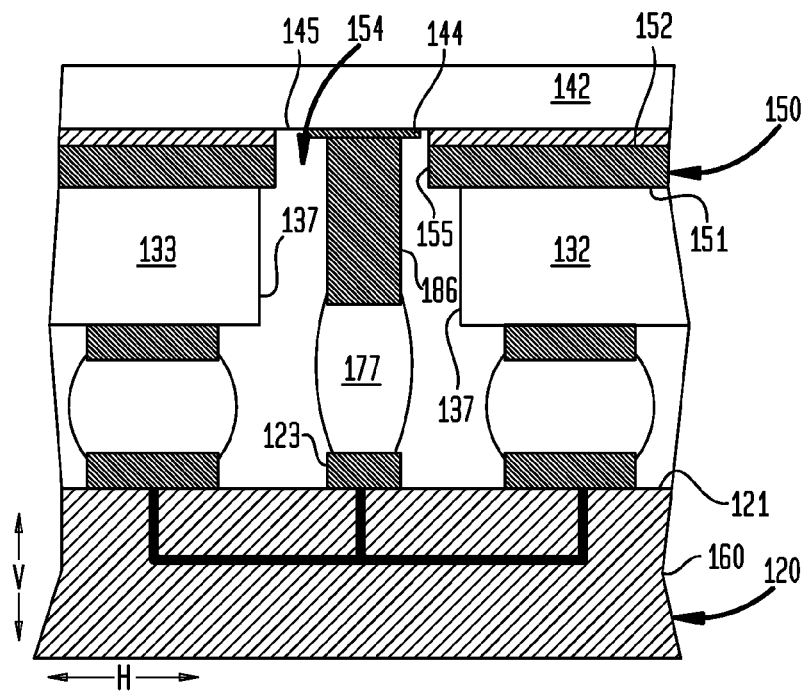
FIG. 5B is an enlarged fragmentary sectional view of an alternative embodiment of FIG. 5A.

FIG. 5B shows an alternate embodiment of the electrical connection between the contacts 144 of the second memory chip 142 and the contacts 123 exposed at the first surface 121 of the interconnection substrate 120 shown in FIG. 4. As shown in FIG. 5B, some or all of the conductive posts 164 of FIG. 4 can be replaced by respective conductive posts 186 and conductive masses 177.

Similar to the conductive posts 86 described with reference to FIG. 3D, each of the conductive posts 186 can extend from a respective conductive contact 144 exposed at the front surface 145 of the second memory chip 142 in the vertical direction V and can be located between opposing lateral edges 137 of the second and third logic chips 132 and 133 in the horizontal direction H.

Such conductive posts 186 can also extend through an opening 154 extending through the heat spreader 150 between the upper and lower surfaces 152 and 151. The second memory chip 142 can be connected to the plurality of electrically conductive traces 162 through at least one of the conductive posts 186.

Each conductive post 186 can be connected with a respective contact 123 by a conductive mass 177. The conductive masses 177 can be solder balls or any other material described above with reference to the conductive masses 27.

Similar to the conductive posts 164 described above with reference to FIG. 5A, in a particular embodiment (not shown), some or all of the conductive posts 186 can conform to a contour of the inner surface 155 of the respective opening 154, such that each conductive post and its respective opening can be considered to be a through heat sink conductive via. In such an embodiment having a conductive post 164 extending through an opening of the heat spreader 150, a dielectric layer can extend between the conductive post and an inner surface of the opening to separate and insulate the conductive post from the heat spreader.

Figure 6:
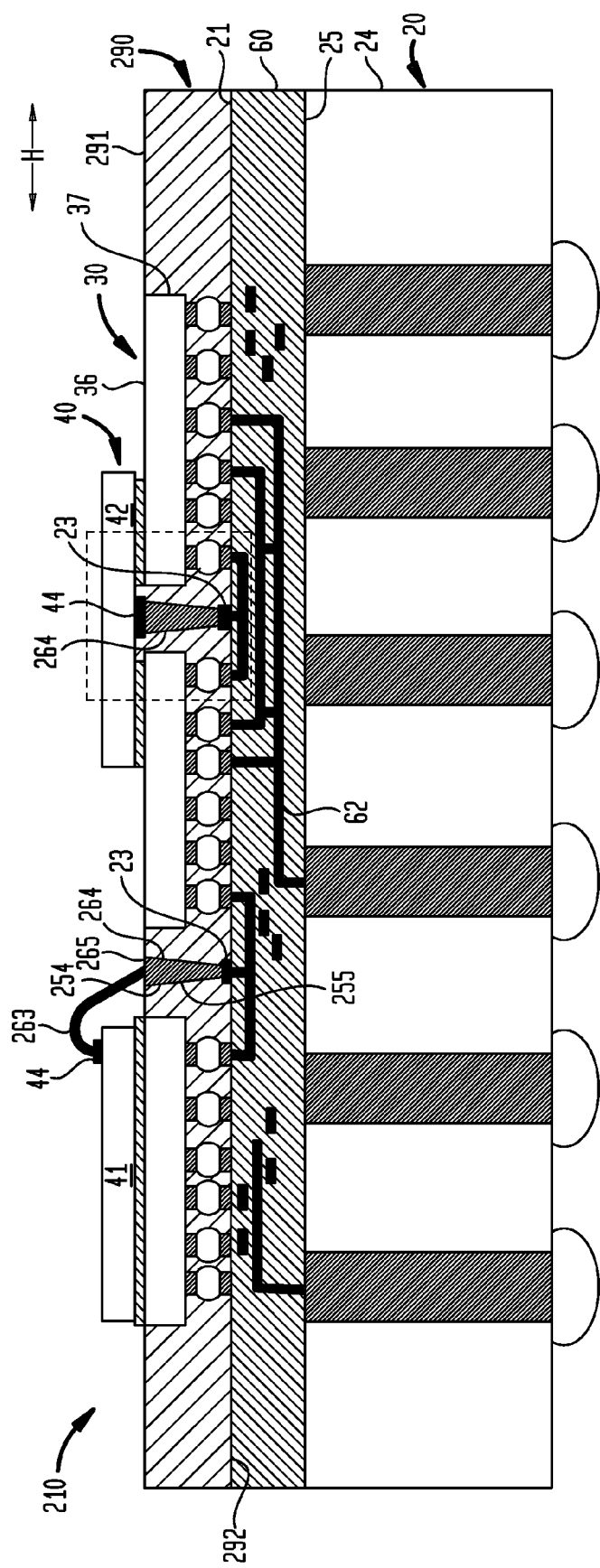
FIG. 6 is a diagrammatic sectional view of a stacked microelectronic assembly according to yet another embodiment having a planarized encapsulant extending between the logic chips.

Referring now to FIG. 6, a microelectronic assembly 210 according to an embodiment of the present invention is the same as the microelectronic assembly 10 described above with reference to FIG. 1, except that the microelectronic assembly 210 includes a planarized encapsulant 290 overlying the first surface 21 of the interconnection substrate 20, and the assembly 210 includes alternate electrical connections between the contacts 44 of the memory chips 40 and the contacts 23 exposed at the first surface 21. Although a heat spreader is not shown in FIG. 6, a heat spreader such as the heat spreader shown in FIG. 1 can be included in the microelectronic assembly 210 overlying the logic chips 30 and/or the memory chips 40.

The planarized encapsulant 290 can extend between the logic chips 30 in the horizontal direction H, such that the planarized encapsulant substantially surrounds the lateral edges 37 of the logic chips. The planarized encapsulant 290 can have a major surface 291 that is planarized with the rear surface 36 of each of the logic chips 30.

The planarized encapsulant 290 can include at least one conductive via 264 extending therethrough between the major surface 291 and a second surface 292 opposite therefrom. Such conductive vias 264 can be located between lateral edges 37 of adjacent ones of the logic chips 30 in the horizontal direction E. At least one of the memory chips 40 can be electrically connected to the plurality of traces 62 through the at least one conductive via 264.

In a particular embodiment, at least one of the conductive vias 264 can be formed by depositing a conductive metal within an opening 254 extending through the planarized encapsulant 290. The depositing of the conductive metal to form the conductive vias 264 can be done by plating of the metal onto an inner surface 255 of the opening 254. The conductive vias 264 can be solid, or the conductive vias can include an internal void that can be filled with a dielectric material. In another example, the conductive vias can be formed by depositing a conductive sintering material into openings in the encapsulant 290, e.g., by a screening, stenciling, or dispensing process, and subsequently curing the sintering material to form a void-free conductive matrix in the openings. In yet another example, a screening, stenciling, or dispensing process can be used to deposit a conductive paste such as solder paste or silver-filled paste, etc. within the openings.

In still another example, the conductive vias 264 can be formed before the logic chips 30 or the memory chips 40 are attached to the interconnection substrate 20. In such an embodiment, a metal layer can be deposited onto the first surface 21 of the interconnection substrate 20 overlying the dielectric layers 60. A mask layer such as a photoresist layer can be applied to locations of the metal layer where it is desired to form the conductive vias 264. Then, the metal layer can be etched away in locations not protected by the mask layer, leaving the conductive vias 264 extending from the first surface 21. Subsequently, the mask layer can be removed and the encapsulant 290 can be applied extending around lateral surfaces of the conductive vias 264 and lateral edges 37 of the logic chips 30.

As shown in FIG. 6, some or all of the contacts 44 of the first memory chip 41 can be electrically connected to the conductive vias 264 by respective wire bonds 263 extending therebetween, such that the first memory chip can be connected to the plurality of electrically conductive traces 62 through the wire bonds and the conductive vias. Each wire bond 263 can extend from a contact 44 to an upper surface 265 of a respective conductive via 264. Each upper surface 265 can be exposed at the major surface 291 of the planarized encapsulant 290.

Figure 7A:
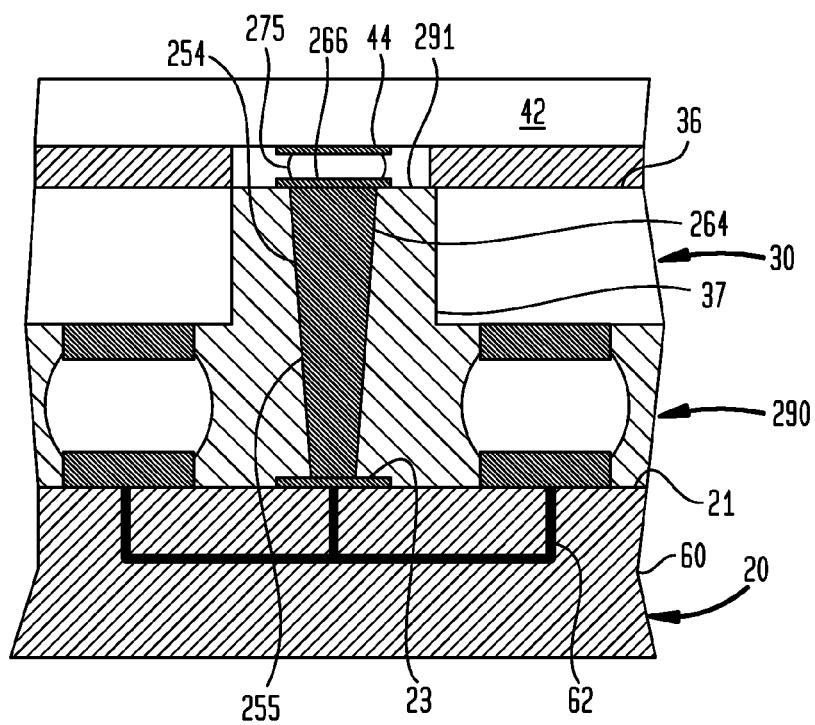
FIG. 7A is an enlarged fragmentary sectional view of a portion of FIG. 6 illustrating an electrical connection between a face-down memory chip and an interconnection substrate.

FIG. 7A shows further details of the electrical connection between the contacts 44 of the second memory chip 42 and the contacts 23 exposed at the first surface 21 of the interconnection substrate 20 shown in FIG. 6. As shown in FIG. 7A, each conductive via 264 can extend between a contact 23 and a conductive pad 266 exposed at the major surface 291 of the planarized encapsulant 290. A conductive mass 275 can extend between each conductive pad 266 and a corresponding contact 44 of the second memory chip 42.

Figure 7B:
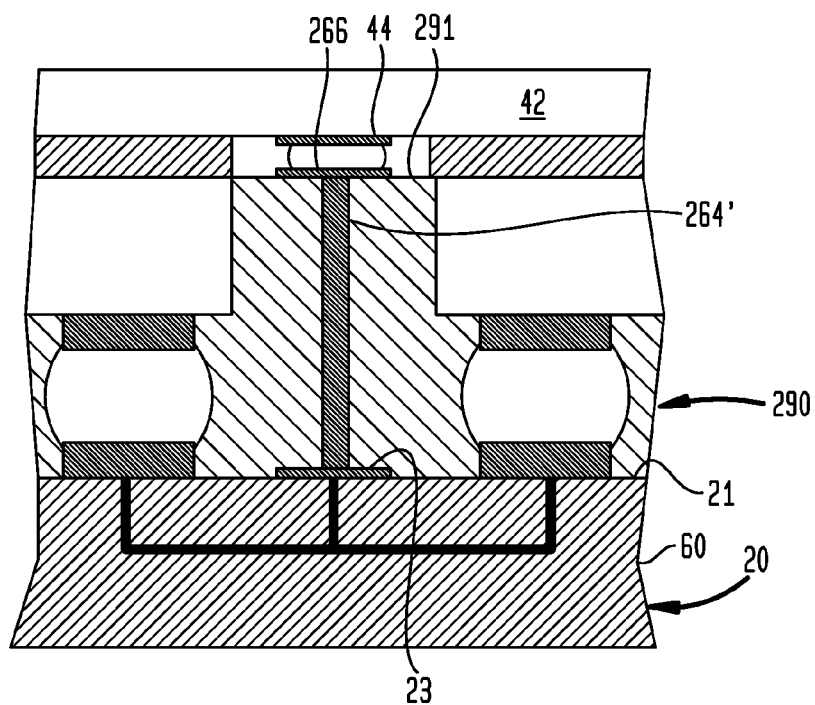
FIG. 7B is an enlarged fragmentary sectional view of an alternative embodiment of FIG. 7A.

FIG. 7B shows an alternate embodiment of the conductive via 264 extending between the contacts 44 of the second memory chip 42 and the contacts 23 exposed at the first surface 21 of the interconnection substrate 20 shown in FIGS. 6 and 7A. As shown in FIG. 7B, a conductive via 264' extending between the contact 23 and the conductive pad 266 exposed at the major surface 291 of the planarized encapsulant 290 can have a cylindrical shape, rather than the frustoconical shape of the conductive via 264 shown in FIG. 7A.

FIG. 8 is a top-down plan view that can correspond to the microelectronic assemblies shown in FIGS. 1 through 7B. As shown in FIG. 8, a microelectronic assembly 310 can include a plurality of logic chips 30 overlying the first surface 21 of the interconnection substrate 20 and memory chips 40 overlying the rear surface 36 of the logic chips. Each memory chip 40 can have any longitudinal orientation relative to the logic chips 30 over which the memory chip lies. It is preferable that each memory chip 40 at least partially overlies the rear surface 36 of at least one logic chip 30.

Figure 9:
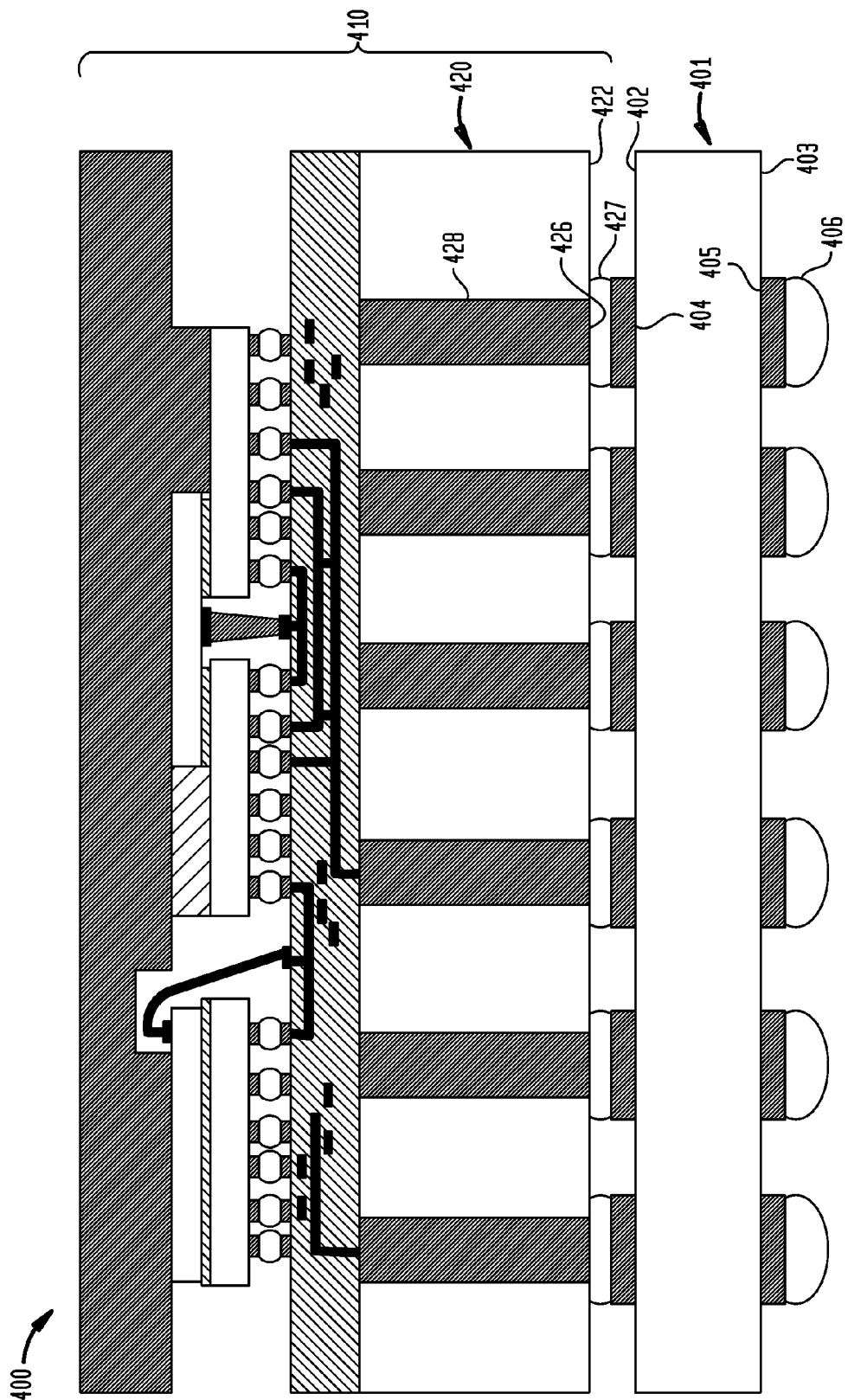
FIG. 9 is a diagrammatic sectional view of a stacked microelectronic assembly according to still another embodiment having a second substrate.

Referring now to FIG. 9, a microelectronic structure 400 according to an embodiment of the present invention can include a microelectronic assembly 410 and a second substrate 401, where the microelectronic 410 can be any of the microelectronic assemblies 10, 110, 210, or 310 described above. In one example, the second substrate 401 can have an effective CTE greater than or equal to 10 ppm/° C.

In a particular embodiment, the second substrate 401 can be a substrate of a package in which the microelectronic assembly 410 is further incorporated. In an exemplary embodiment, the second substrate 401 can be a circuit panel such as a motherboard. In one embodiment, the second substrate 401 can be a module substrate that can be further connected to a circuit panel or another component.

The second substrate 401 can have a first surface 402 and a second surface 403 opposite the first surface. The first surface 402 of the second substrate 401 can face the second surface 422 of the interconnection substrate 420. The second substrate 401 can have conductive contacts 404 exposed at the first surface 402 and electrical terminals 405 exposed at the second surface 403 for connection with another component, such as a circuit board. In a particular embodiment, the electrical terminals 405 can be on the second surface 403 that is opposite the first surface 402 that faces the interconnection substrate 420.

Each conductive contact 404 can be electrically connected with a respective electrical terminal 426 of the interconnection substrate 420 by a conductive mass 427. The electrical terminals 405 can be electrically connected to another component through conductive masses 406. The conductive masses 406 and 427 can be solder balls or any other material described above with reference to the conductive masses 27.

Figure 10:
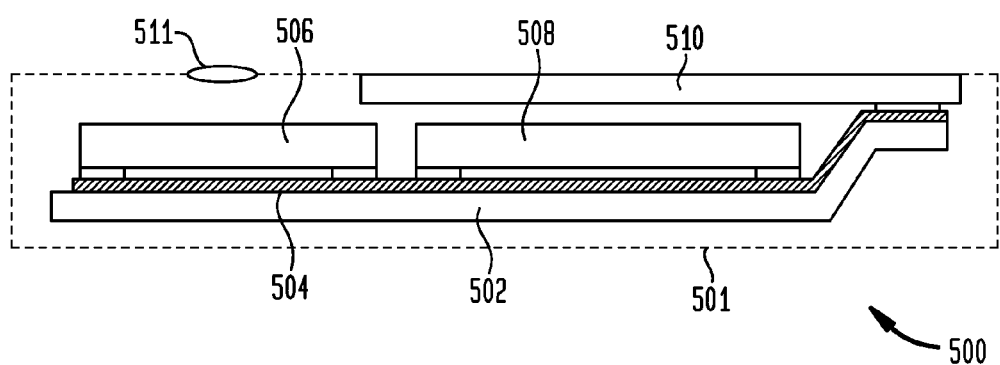
FIG. 10 is a schematic depiction of a system according to one embodiment of the invention.

The microelectronic assemblies described above can be utilized in construction of diverse electronic systems, as shown in FIG. 10. For example, a system 500 in accordance with a further embodiment of the invention includes a microelectronic assembly 506 as described above in conjunction with other electronic components 508 and 510. The microelectronic assembly 506 can be any of the microelectronic assemblies 10, 110, 210, or 310 described above, or the microelectronic assembly 506 can be the microelectronic structure 400 described above. In the example depicted, component 508 is a semiconductor chip whereas component 510 is a display screen, but any other components can be used. Of course, although only two additional components are depicted in FIG. 10 for clarity of illustration, the system may include any number of such components. The microelectronic assembly 506 may be any of the assemblies described above. In a further variant, any number of such microelectronic assemblies may be used.

Microelectronic assembly 506 and components 508 and 510 are mounted in a common housing 501, schematically depicted in broken lines, and are electrically interconnected with one another as necessary to form the desired circuit. In the exemplary system shown, the system includes a circuit panel 502 such as a circuit board or flexible printed circuit board, and the circuit panel includes numerous conductors 504, of which only one is depicted in FIG. 10, interconnecting the components with one another. However, this is merely exemplary; any suitable structure for making electrical connections can be used.

The housing 501 is depicted as a portable housing of the type usable, for example, in a cellular telephone or personal digital assistant, and screen 510 is exposed at the surface of the housing. Where structure 506 includes a light-sensitive element such as an imaging chip, a lens 511 or other optical device also may be provided for routing light to the structure. Again, the simplified system shown in FIG. 10 is merely exemplary; other systems, including systems commonly regarded as fixed structures, such as desktop computers, routers and the like can be made using the structures discussed above.

The openings and conductive elements disclosed herein can be formed by processes such as those disclosed in greater detail in the co-pending, commonly assigned U.S. patent application Ser. Nos. 12/842,587, 12/842,612, 12/842,651, 12/842,669, 12/842,692, and 12/842,717, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising:
an interconnection substrate having a first surface, a second surface remote from the first surface in a vertical direction, conductive structure thereon, and terminals exposed at the second surface for connection with a component;
at least two logic chips overlying the first surface of the substrate, each logic chip having a plurality of signal contacts at a front surface thereof confronting the first surface of the interconnection substrate, the signal contacts of each logic chip being directly electrically connected to the signal contacts of the other logic chips through the conductive structure of the substrate for transfer of signals between the logic chips, the signals representing at least one of data or instructions, the logic chips being adapted to simultaneously execute a set of instructions of a given thread of a process, and each logic chip having a rear surface opposite the front surface; and
a memory chip having a front surface with contacts thereon, the front surface of the memory chip confronting the rear surface of each of the at least two logic chips, the contacts of the memory chip being directly electrically connected to the signal contacts of at least one of the at least two logic chips through the conductive structure of the substrate.

2. The microelectronic assembly as claimed in claim 1, further comprising an intermediate interposer substrate located between first and second logic chips of the at least two logic chips in a horizontal direction perpendicular to the vertical direction, the intermediate interposer substrate having at least one conductive via extending therethrough between opposing first and second surfaces thereof, wherein the conductive structure of the substrate includes the at least one conductive via.

3. The microelectronic assembly as claimed in claim 1, further comprising at least one solder connect extending from the front surface of the memory chip in the vertical direction and located between first and second logic chips of the at least two logic chips in a horizontal direction perpendicular to the vertical direction, wherein the conductive structure of the substrate includes the at least one solder connect.

4. The microelectronic assembly as claimed in claim 1, further comprising at least one conductive pillar extending from the interconnection substrate in the vertical direction and located between first and second logic chips of the at least two logic chips in a horizontal direction perpendicular to the vertical direction, wherein the conductive structure of the substrate includes the at least one conductive pillar, each conductive pillar being electrically connected to a respective conductive element exposed at the front surface of the memory chip by a conductive mass.

5. The microelectronic assembly as claimed in claim 1, further comprising at least one conductive post extending from the front surface of the memory chip in the vertical direction and located between first and second logic chips of the at least two logic chips in a horizontal direction perpendicular to the vertical direction, wherein the conductive structure of the substrate includes the at least one conductive post, each conductive post being electrically connected to a respective conductive element exposed at the first surface by a conductive mass.

6. The microelectronic assembly as claimed in claim 1, further comprising at least one conductive pillar extending from the interconnection substrate in the vertical direction and at least one conductive post extending from the front surface of the memory chip in the vertical direction, each of the conductive pillars and posts located between first and second logic chips of the at least two logic chips in a horizontal direction perpendicular to the vertical direction, wherein the conductive structure of the substrate includes the conductive pillars and posts, each conductive pillar being electrically connected to a respective conductive post by a conductive mass.

7. The microelectronic assembly as claimed in claim 1, wherein the interconnection substrate includes at least one raised surface extending above the first surface in the vertical direction, the at least one raised surface located between first and second logic chips of the at least two logic chips in a horizontal direction perpendicular to the vertical direction, wherein the conductive structure of the substrate includes at least one conductive contact of the at least one raised surface.

8. The microelectronic assembly as claimed in claim 7, wherein the at least one raised surface includes a plurality of stacked dielectric layers overlying the first surface of the interconnection substrate.

9. The microelectronic assembly as claimed in claim 1, further comprising an encapsulant having a substantially planar major surface, the encapsulant extending between first and second logic chips of the at least two logic chips in a horizontal direction perpendicular to the vertical direction, wherein the major surface of the encapsulant is substantially co-planar with the rear surface of each of the first and second logic chips.

10. The microelectronic assembly as claimed in claim 9, wherein the encapsulant has at least one conductive via extending therethrough between the major surface and a second surface opposite the major surface, and the conductive structure of the substrate includes the at least one conductive via.

11. A microelectronic assembly, comprising:
an interconnection substrate having a first surface, a second surface remote from the first surface in a vertical direction, conductive structure thereon, and terminals exposed at the second surface for connection with a component;
at least two logic chips overlying the first surface of the substrate, the logic chips having adjacent parallel edges spaced apart by no more than 500 microns, each logic chip having a plurality of signal contacts at a front surface thereof confronting the first surface of the interconnection substrate, the signal contacts of each logic chip being directly electrically connected to the signal contacts of the other logic chips through the conductive structure of the substrate for transfer of signals between the logic chips, the signals representing at least one of data or instructions, the logic chips being adapted to simultaneously execute a set of instructions of a given thread of a process, and each logic chip having a rear surface opposite the front surface; and
a memory chip having a front surface with contacts thereon and a rear surface opposite the front surface, the front surface of the memory chip confronting the rear surface of at least one of the at least two logic chips, the contacts of the memory chip being directly electrically connected to the signal contacts of at least one of the at least two logic chips through the conductive structure of the substrate.

12. The microelectronic assembly as claimed in claim 11, further comprising at least one wire bond extending from the front surface of the memory chip to the first surface of the interconnection substrate, the at least one wire bond located between first and second logic chips of the at least two logic chips in a horizontal direction perpendicular to the vertical direction, wherein the conductive structure of the substrate includes the at least one wire bond.

13. The microelectronic assembly as claimed in claim 1 or claim 11, wherein the interconnection substrate has an effective CTE less than 10 ppm/° C.

14. The microelectronic assembly as claimed in claim 13, further comprising a second substrate having a surface that faces the second surface of the interconnection substrate, the second substrate having contacts electrically connected with the terminals of the interconnection substrate, the second substrate having an effective CTE greater than or equal to 10 ppm/° C. and having second terminals on a surface opposite the surface that faces the interconnection substrate.

15. The microelectronic assembly as claimed in claim 1 or claim 11, wherein the interconnection substrate has an effective CTE less than 7 ppm/° C.

16. The microelectronic assembly as claimed in claim 1 or claim 11, wherein the at least two logic chips have substantially identical structure.

17. The microelectronic assembly as claimed in claim 1 or claim 11, wherein the conductive structure of the substrate includes a plurality of electrically conductive traces extending in a direction substantially parallel to the first surface.

18. The microelectronic assembly as claimed in claim 1 or claim 11, further comprising a heat spreader at least partially overlying a rear surface of at least one of the logic chips.

19. The microelectronic assembly as claimed in claim 18, wherein the heat spreader at least partially overlies the memory chip.

20. The microelectronic assembly as claimed in claim 19, wherein the memory chip has a first width in a horizontal direction perpendicular to the vertical direction and first and second logic chips of the at least two logic chips have a combined second width in the horizontal direction, the first width being less than the second width.

21. The microelectronic assembly as claimed in claim 20, wherein the heat spreader includes a pedestal portion extending beyond a lower surface thereof, the pedestal portion contacting the rear surface of at least one of the first and second logic chips.

22. The microelectronic assembly as claimed in claim 18, wherein the memory chip at least partially overlies an upper surface of the heat spreader.

23. The microelectronic assembly as claimed in claim 22, wherein the conductive structure of the substrate includes a lead extending through an opening in the heat spreader.

24. The microelectronic assembly as claimed in claim 22, further comprising a plurality of heat spreaders including said heat spreader, each of the plurality of heat spreaders at least partially overlying a rear surface of at least one of the logic chips, wherein the conductive structure of the substrate includes a lead extending between edges of two adjacent ones of the plurality of heat spreaders.

25. A system comprising a structure according to claim 1 or claim 11 and one or more other electronic components electrically connected to the structure.

26. A system as claimed in claim 25, further comprising a housing, said structure and said other electronic components being mounted to said housing.

* * * * *